United States Patent [19]

Nonomura et al.

[11] Patent Number: 5,601,645
[45] Date of Patent: Feb. 11, 1997

[54] SUBSTRATE HOLDER FOR A SUBSTRATE SPIN TREATING APPARATUS

[75] Inventors: Masahiro Nonomura; Masaru Kitagawa, both of Kyoto, Japan

[73] Assignee: Dainippon Screen Mfg. Co., Ltd., Japan

[21] Appl. No.: 326,525

[22] Filed: Oct. 20, 1994

[30] Foreign Application Priority Data

Oct. 28, 1993 [JP] Japan ................................ 5-294212

[51] Int. Cl.⁶ ............................................ B05C 11/02
[52] U.S. Cl. ............................................ 118/52; 118/500
[58] Field of Search ............................. 134/902, 153; 427/240; 118/52, 500, 56

[56] References Cited

FOREIGN PATENT DOCUMENTS

| 0294819 | 12/1986 | Japan | 118/52 |
| 0219522 | 9/1987 | Japan | 118/52 |
| 0015925 | 1/1989 | Japan | 118/52 |
| 4-65446 | 6/1992 | Japan | |
| 5-90238 | 4/1993 | Japan | |

*Primary Examiner*—Brenda A. Lamb
*Attorney, Agent, or Firm*—Ostrolenk, Faber, Gerb & Soffen, LLP

[57] ABSTRACT

A substrate holder for use in a substrate spin treating apparatus carries out a desired treatment of a substrate by supplying treating liquid to a surface of the substrate while spinning the substrate. The substrate holder includes a turntable rotatable in a horizontal plane and a motor for rotating the turntable. Support pins are arranged on the turntable for supporting the substrate in a horizontal posture above and spaced from a surface of the turntable. A vertically movable disk of a size at least corresponding to the substrate is disposed between the turntable and the substrate being supported by the support pins. A raising and lowering device is provided for lowering the vertically movable disk to a lower position adjacent the turntable when the turntable is at rest, and raising the vertically movable disk to an upper position adjacent a substrate on the support pins when the turntable is in rotation to effect the treatment.

17 Claims, 10 Drawing Sheets spinning direction

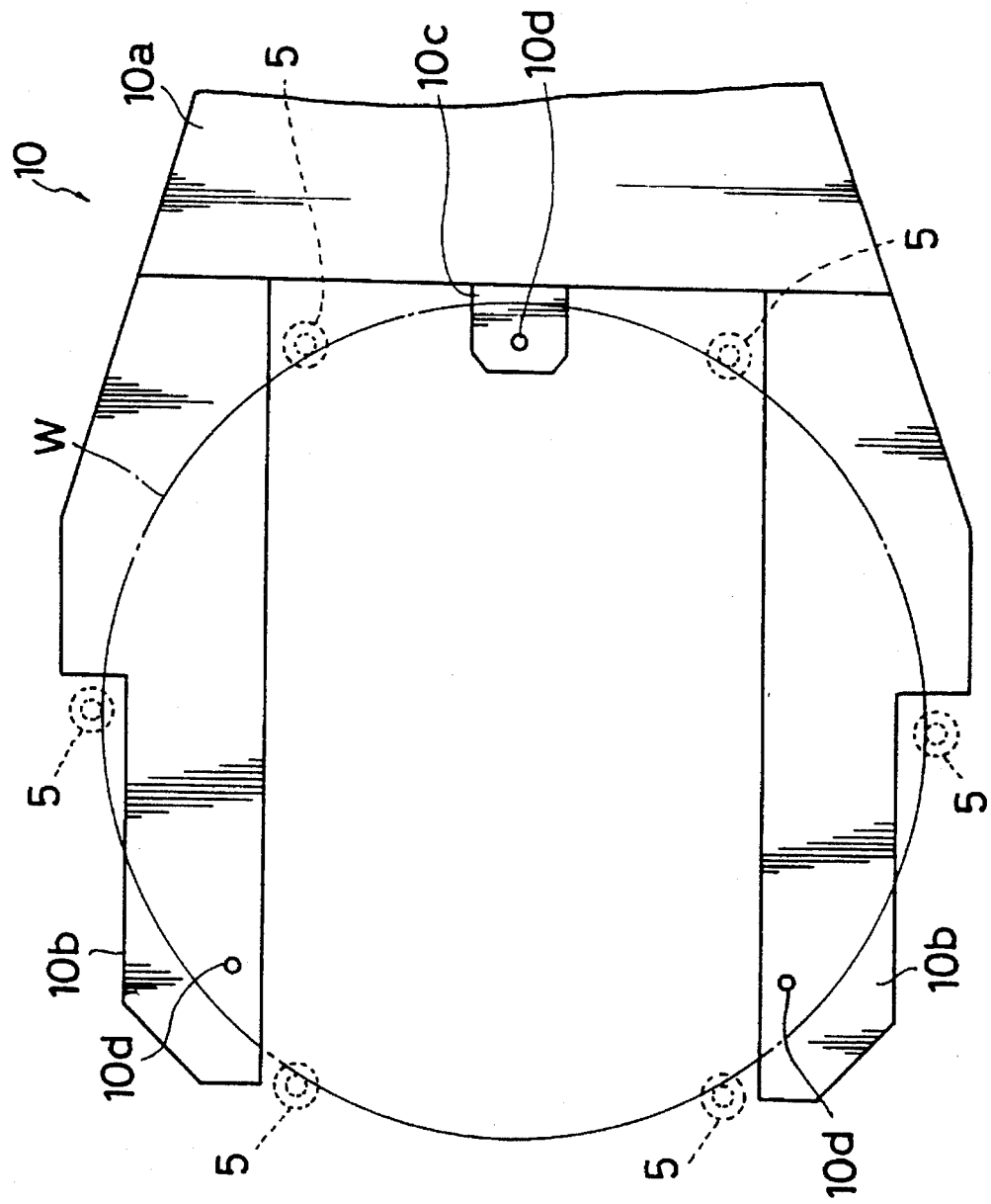

SUBSTRATE HOLDER FOR A SUBSTRATE SPIN TREATING APPARATUS

BACKGROUND OF THE INVENTION

(1) Field of the Invention

The present invention relates to substrate spin treating apparatus for treating substrates, such as semiconductor wafers, glass substrates for liquid crystal displays, or glass substrates for photomasks, by supplying a photoresist solution, cleaning liquid, etching solution or other treating liquid to substrate surfaces while spinning the substrates. More particularly, the invention relates to a substrate holder for such a substrate spin treating apparatus for supporting a substrate horizontally and slightly above a turntable on which the substrate is placed.

(2) Description of the Related Art

Substrate holders for spin treating apparatus of the type noted above are disclosed in Japanese Patent Publication (Unexamined) No. 1993-90238 and Japanese Utility Model Publication (Unexamined) No. 1992-65446, for example.

This type of substrate holder includes a plurality of substrate support pins which project above an upper surface of a turntable on which a substrate is placed. These support pins support the substrate while maintaining edges of the substrate in place. With such a substrate holder, the substrate is supported slightly above the upper surface of the turntable, to avoid damage and contamination of the lower surface or reverse side of the substrate which would occur if the substrate were placed in contact with the turntable. However, mist formed by scattering of the treating liquid during a treating operation could drift under the substrate and adhere to the reverse side thereof, thereby contaminating the lower surface of the substrate. To prevent the mist from drifting to the reverse side of the substrate, what is known as back-rinsing is carried out in which pure water or the like is sprayed to the reverse side during a spin treatment.

The conventional construction noted above has the following drawbacks. That is in a photoresist coating process, for example, the mist adhering to the reverse side of the substrate hardens thereon if the above back-rinsing fails to keep the mist away from the reverse side effectively. In an exposure process to follow, for example, the upper surface or reverse side of the substrate has a subtly varying height due to different thicknesses of the solids formed of hardened mist on the reverse side. This causes exposure optics to be defocused, thereby making it impossible to expose a pattern on the substrate surface properly. Therefore, in some cases, the substrate is cleaned prior to the exposure process to remove the solids from the reverse side of the substrate.

In the cleaning operation, the substrate is supported by the spinning holder, with the obverse side thereof carrying the photoresist facing downward. The substrate is spun in this state and the reverse side of the substrate is cleaned with a cleaning brush or high pressure water jet applied thereto.

As noted above, back-rinsing may be carried out at this time in order to prevent mist of the cleaning liquid from adhering to the obverse side (photoresist film) of the substrate facing downward. However, this could damage the photoresist film formed on the obverse side of the substrate.

If the reverse side is cleaned without the back-rinsing to avoid damage to the photoresist film, then the mist will adhere to the photoresist film on the obverse side of the substrate. It is extremely difficult to remove the mist adhering to the photoresist film later on.

On the other hand, it is conceivable to reduce the height of the substrate support pins arranged on the turntable to minimize the gap between the substrate and turntable, thereby preventing mist from entering the gap. However, such a construction would make it difficult to employ an ordinary substrate transport mechanism with a transport arm for suction-supporting a substrate and entering a space corresponding to the gap between the turntable and the lower surface of the substrate, to transfer the substrate onto the support pins. Thus, a special substrate transport mechanism would be required if the support pins were reduced in height.

SUMMARY OF THE INVENTION

The present invention has been made having regard to the state of the art noted above, and its object is to provide a substrate holder for a substrate spin treating apparatus, which facilitates transport of substrates while preventing mist produced during upper surface treatment from adhering to lower surfaces of the substrates.

According to the present invention, the above object is achieved by a substrate holder for use in a substrate spin treating apparatus which carries out a desired treatment of a substrate by supplying treating liquid to a surface of the substrate while spinning the substrate, with the substrate holder comprising:

a turntable rotatable in a horizontal plane;

a driving device for rotating the turntable;

a supporting device arranged on the turntable for supporting the substrate in horizontal posture and spaced from a surface of the turntable;

a vertically movable member disposed above the turntable and having a size at least corresponding to the substrate; and a raising and lowering device for lowering the vertically movable member to a lower position adjacent the turntable when the turntable is at rest, and raising the vertically movable member to an upper position adjacent the substrate when the turntable is in rotation to effect the treatment.

During the substrate treatment that also produces a mist, with the turntable rotated by the driving device, the raising and lowering device arranged between the substrate and turntable raises the vertically movable member to the upper position. This results in a reduced gap between the lower surface of the substrate and the upper surface of the movable member, to prevent the mist from drifting to the lower surface of the substrate. Thus, the lower surface of the substrate is protected from mist adhesion.

When the mist is not produced, i.e. when the turntable is at rest for allowing the substrate to be transported into or out of the apparatus, the raising and lowering device moves the movable member to the lower position to provide a large gap between the lower surface of the substrate and the upper surface of the movable member. This provides sufficient clearance to permit a transport arm or the like to transport the substrate with ease.

Preferably, the vertically movable member is slightly larger than the substrate, when in the upper position, this movable member produces an enhanced effect of preventing the mist from flowing to the lower surface of the substrate.

Preferably, the support device comprises a plurality of support pins, each of which may advantageously comprise a cylindrical shank extending through the vertically movable member, a flange formed at an upper end of the shank and having an upper surface thereof sloping downward to contact and support an edge of the substrate, and a small projection formed on the flange for preventing horizontal movement of the substrate.

The downwardly sloping flange of each support pin for contacting and supporting an edge of the substrate results in a small area of contact with the substrate. This provides an advantage of protecting the substrate from contamination. The small projection formed on the flange is effective to prevent horizontal movement of the substrate during the spin treatment. The flange extending outwardly of the shank serves to limit the upward movement of the vertically movable member. Thus, the flange determines the upper position of the movable member.

Preferably, the vertically movable member has guide bores formed in peripheral positions thereof corresponding to the support pins, what with these guide bores having a slightly larger diameter than the shanks of the support pins. Since the guide bores have a slightly larger diameter than the shanks of the support pins, the upward movement of the movable member is limited by the lower surfaces of the flanges. Thus, the upper position of the movable member is determined by the flanges.

Further, the vertically movable member may have outwardly opening U-shaped guide cutouts formed in peripheral positions thereof corresponding to the support pins, with these guide cutouts having a slightly larger width than the shanks of the support pins.

In a preferred embodiment of the invention, the raising and lowering device comprises a plurality of hoisting mechanisms arranged on the lower surface of the turntable, each of the hoisting mechanisms including an inverted L-shaped hoisting member having a working arm and a depending arm, a weight fixed to a lower end of the depending arm, a pin extending through an intermediate bend portion of the hoisting member, and bearings for supporting the pin such that an axis of the pin extends tangentially of rotation of the turntable and with the working arm is disposed outwardly of the pin, the turntable defining a plurality of openings each for allowing the working arm to project upward when the turntable is in rotation.

As the rotating velocity of the turntable increases, an increasing centrifugal force acts on the weights of the plurality of hoisting mechanisms, whereby the depending arms carrying the weights swing outward. Then the working arms of the hoisting members pivot about the pins extending through the intermediate bend portions of the hoisting members, to project above the upper surface of the turntable through the openings. The vertically movable member is raised by these working arms, and maintained in the upper position by engaging the lower surfaces of the flanges support pin. As the rotating velocity of the turntable decreases, a decreasing centrifugal force acts on the weights of the plurality of hoisting mechanisms, whereby the depending arms swing inward to their original positions. Consequently, gravity returns the vertically movable member raised by the working arms of the hoisting mechanisms returns to the lower position.

This construction utilizes the centrifugal force generated by rotation of the turntable, for causing the hoisting member of each hoisting mechanism to pivot, thereby driving the vertically movable member. Thus, no actuator, such as an air cylinder or motor, is required for raising or lowering the vertically movable member. Moreover, the movable member is movable according to the rotating velocity of the turntable, which requires no control of timing for driving the movable member.

The vertically movable member in the upper position forms a gap of 1 to 1.5 mm, for example, between the lower surface of the substrate and the upper surface of the vertically movable member.

Preferably, the turntable has a plurality of tiny projections formed on the upper surface thereof to minimize an area of contact between the turntable and vertically movable member. Thus, even if the treating liquid exists between the turntable and movable member, the movable member may be raised off the turntable with ease. Alternatively, the vertically movable member may have a plurality of tiny projections formed on the lower surface thereof.

Each of the guide bores may advantageously have an inner edge shaped to have a semicircular wall section for contacting the shank of the support pin. As the turntable rotates, the guide bores are pressed against the shanks of the support pins. In this state, the movable member moves vertically to the upper position or lower position. The inner edges of each guide bore has a semicircular wall section resulting in a reduced area of contact with the shank, allowing the movable member to move up and down smoothly along the shanks.

Preferably, each shank has a downwardly sloping forward side with respect to a direction of rotation of the turntable and the movable member begins to rotate in the same direction as the turntable, with the inward walls of the guide bores pressed against the shanks of the support pins. Consequently, the movable member is subjected to a composite vector combining an upward vector exerted by each hoisting mechanism and a vector opposite to the rotating direction of the turntable. This composite vector has an obliquely upward direction opposite to the rotating direction of the turntable. By shaping each shank to slope downward along this vector, the movable member may move upward smoothly.

In a different embodiment of the invention, the raising and lowering device comprises a plurality of fins arranged peripherally of the vertically movable member, the fins being formed by cutting the vertically movable member from peripheral edges toward a center thereof to form tongues downward, and bending the tongues by a predetermined angle.

With rotation of the turntable, the vertically movable member rotates also. Then the fins bent downward by the predetermined angle push ambient gas downward. In reaction thereto, an upward component of force, or lift, acts on the fins to raise the movable member to the upper position. When the rotating velocity of the turntable becomes slower, the lift diminishes to allow the movable member to return to the lower position.

This construction utilizes the lift acting on the fins with rotation of the turntable, to move the vertically movable member without an additional actuator being required for driving the movable member. Further, since the movable member is driven up and down according to the rotating velocity of the turntable, no control of timing is required for driving the movable member, either.

The raising and lowering device may comprise an actuator for vertically driving the vertically movable member with a push rod extending through an opening formed in the turntable and having an upper end attached to the lower surface of the vertically movable member.

The vertically movable member is driven by the actuator through the push rod and movement of the former to the upper position or lower position may be controlled freely by adjusting timing for the actuator to raise and lower the push rod. Preferably, the actuator comprises an air cylinder connected to a bearing rotatably supporting a lower end of the push rod.

In a further embodiment of the invention, the raising and lowering device comprises a bellows extending through a central opening of the turntable and having an end thereof connected to the lower surface of the vertically movable member, and an actuator connected to the other end of the bellows for extending and contracting the bellows.

The vertically movable member is driven by the actuator connected to the bellows. Its movement to the upper position or lower position may be controlled freely by adjusting timing for the actuator to extend and contract the bellows.

Preferably, the actuator includes a pressurized air supply device for extending the bellows by feeding air under pressure into the other end of the bellows, and a suction device for contracting the bellows by sucking air therefrom.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

FIG. 13 is a plan view of a transport arm.

DETAILED DESCRIPTION OF THE PREFERRED EMBODIMENTS

Preferred embodiments of the present invention will be described in detail hereinafter with reference to the drawings.

First Embodiment

Figure 1:
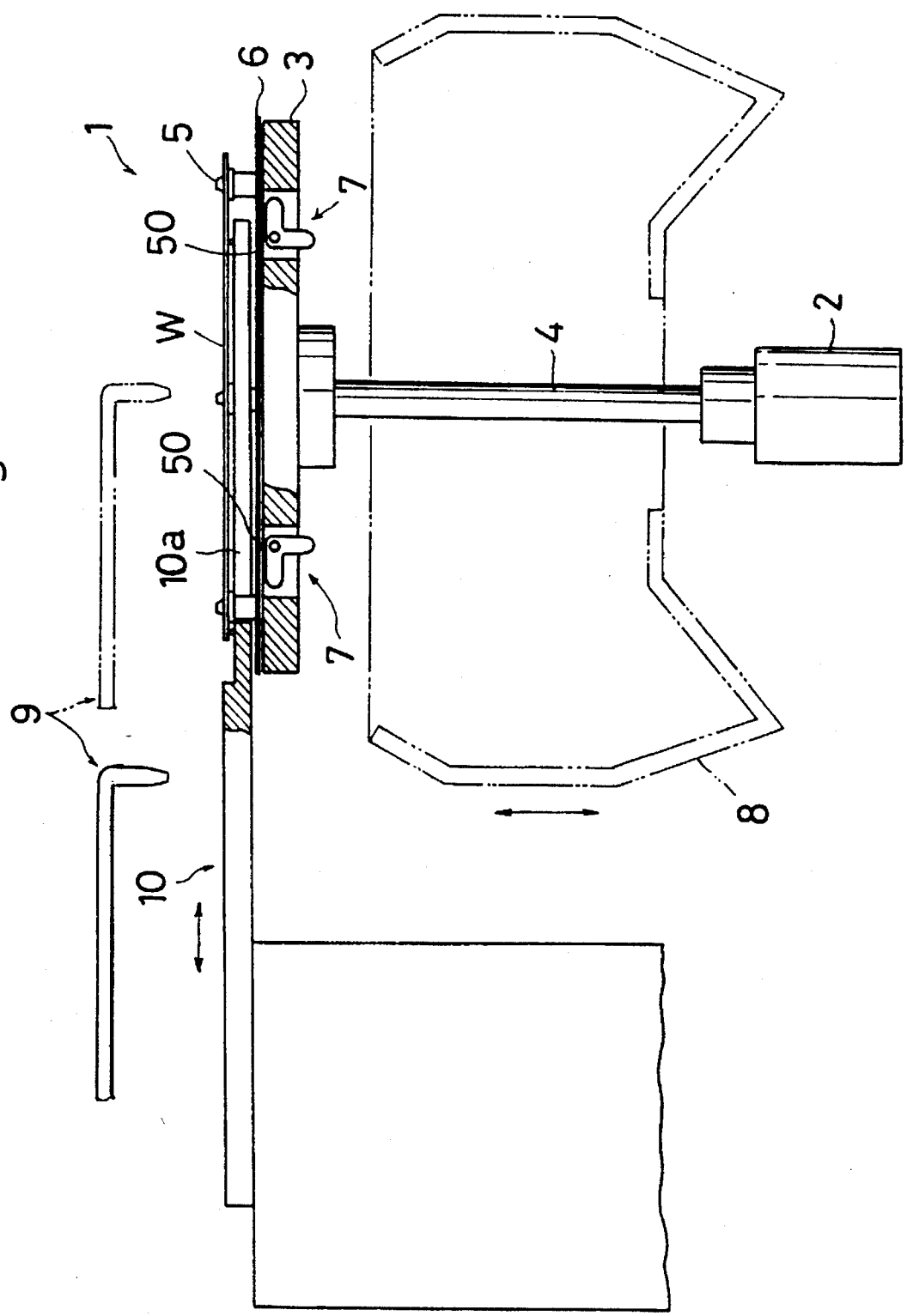
FIG. 1 is a partly sectioned front elevation showing an outline of substrate spin treating apparatus that includes a substrate holder according to a first embodiment of the invention.
Figure 2:
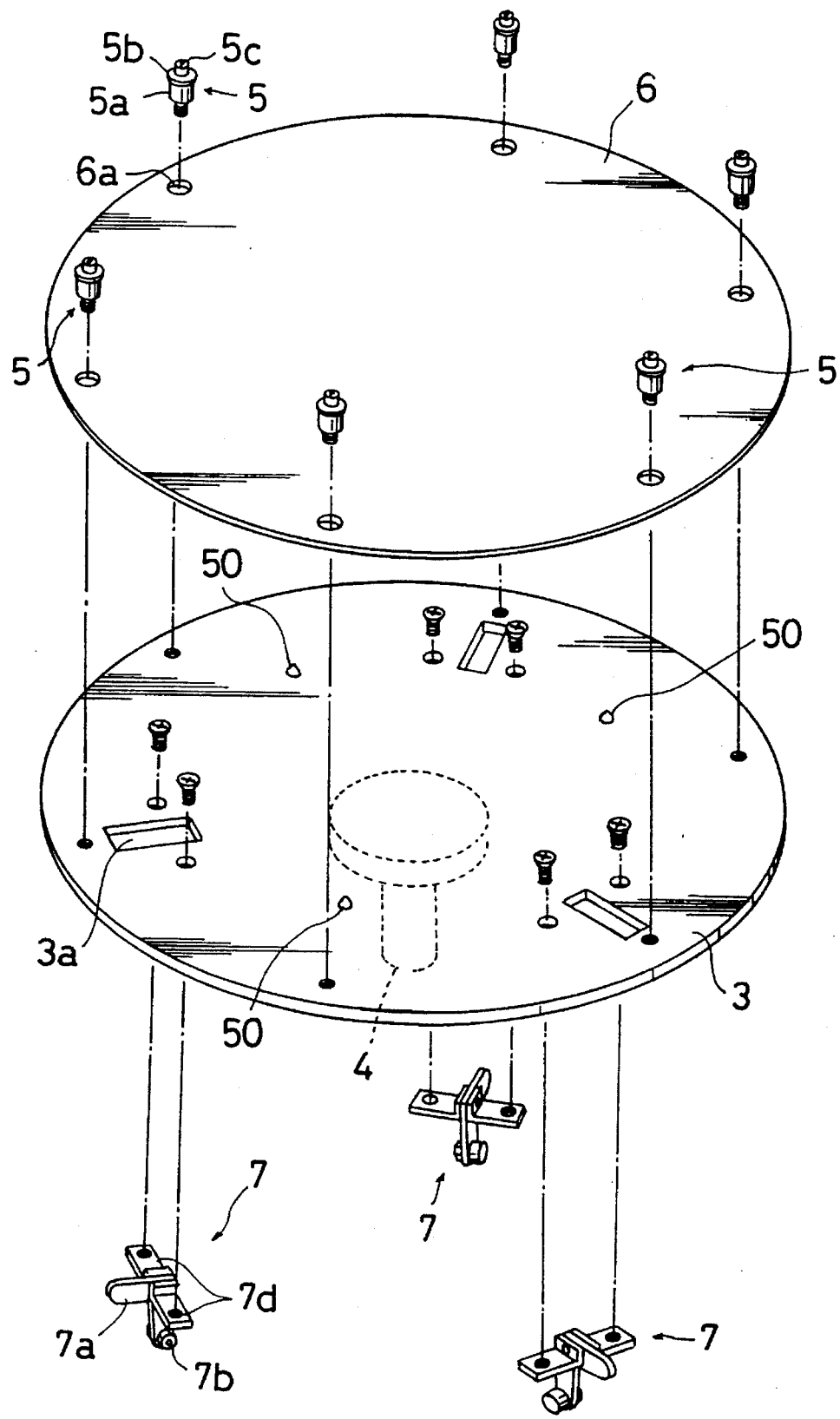
FIG. 2 is an exploded perspective view of a substrate holder in the first embodiment.
Figure 3:
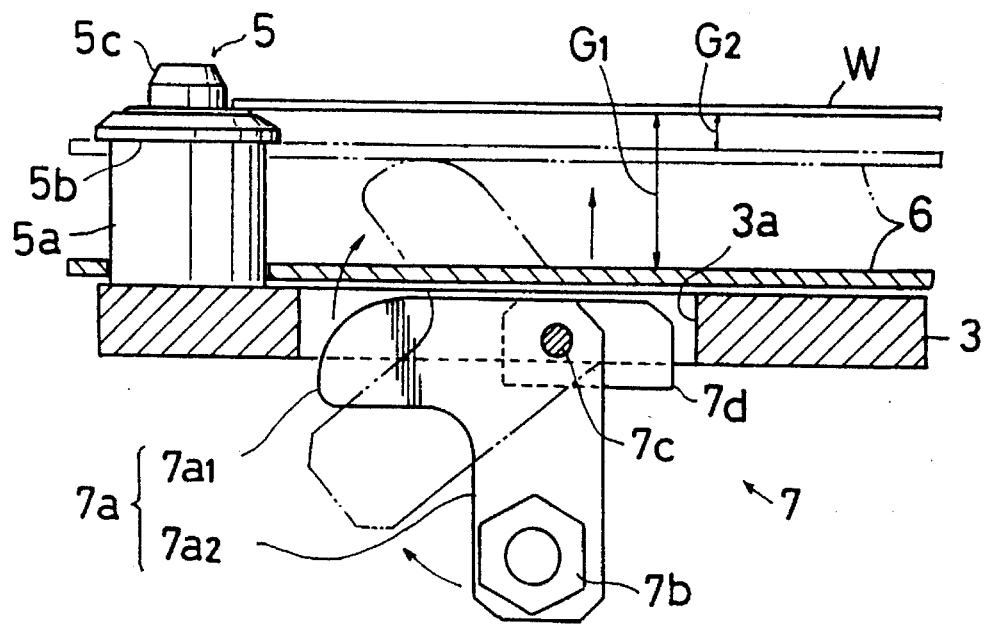
FIG. 3 is a fragmentary cross-section of the substrate holder taken through a vertical plane.

Referring particularly to the embodiment illustrated in FIGS. 1 through 3 wherein numeral 1 in FIG. 1 denotes a substrate holder for supporting and spinning a substrate such as a semiconductor wafer W. The substrate holder 1 includes a turntable 3 connected through a rotary shaft 4 to a motor 2 acting as a driving device rotatable in a fixed direction. The turntable 3 has a plurality of support pins 5 screwed tight to an upper surface thereof to act as a supporting device for contacting edges of the wafer W to support the wafer in horizontal posture. Further, the turntable 3 defines a plurality of tiny projections 50.

As shown in FIGS. 2 and 3, each support pin 5 includes, as integral parts thereof, a cylindrical shank 5a, a flange 5b formed at an upper end of the shank 5a and having an upper surface thereof sloping downward to contact and support an edge of wafer W, and a small projection 5c formed on the flange 5b for preventing horizontal movement of wafer W.

A vertically movable disk 6 formed of a thin plate material is placed over the upper surface of the turntable 3. The movable disk 6 has guide bores 6a formed in peripheral positions thereof corresponding to the support pins 5. The guide bores 6a have a slightly larger diameter than the shanks 5a of the support 5. The support pins 5 extend through the guide bores 6a, respectively, to be secured to the turntable 3. Thus, the movable disk 6 is movable only vertically under guiding action of the shanks 5a of the support pins 5. The vertically movable disk 6 should have a size at least corresponding to the wafer W in order to prevent mist from adhering to a lower surface of wafer W. In this embodiment, the movable disk 6 is slightly larger than the wafer W.

The turntable 3 has 7 arranged equidistantly in peripheral positions and securely screwed to the lower surface thereof for vertically driving the movable disk 6. Each hoisting mechanism 7 includes an inverted L-shaped hoisting member 7a having a working arm $7a_1$ and a depending arm $7a_2$. A weight 7b is fixed to a lower end of the depending arm $7a_2$. A pin 7c extends through an intermediate bend portion of the hoisting member 7a, with opposite ends of the pin 7c supported by bearings 7d. Each hoisting mechanism 7 is attached to the turntable 3, with the axis of pin 7c extending tangentially of rotation of the turntable 3, the working arm $7a_1$ being disposed outwardly of the pin 7c, and the hoisting member 7a being pivotable about the axis of pin 7c. The turntable 3 defines openings 3a in positions where the hoisting mechanisms 7 are attached, for allowing the working arms $7a_1$ to pivot above the upper surface of the turntable 3.

The substrate holder 1 is surrounded by a vertically movable cup-shaped housing 8 for preventing scattering of treating liquid. Further, a nozzle 9 is disposed above the substrate holder 1 to be movable horizontally for supplying the treating liquid. The treating liquid may be a photoresist solution, cleaning liquid such as pure water, a developing solution or an etching solution, depending on the type of treatment given. The nozzle 9 may have a varied construction for supplying the treating liquid to suit the type of treatment.

A transport arm 10 is disposed laterally of the substrate spin treating apparatus to be vertically movable and extendible and retractable. This transport arm 10 is operable to introduce the wafer W into the treating apparatus and deliver it to the substrate holder 1, and to receive the wafer W from the substrate holder 1 and transport it out of the treating apparatus after the treatment. The transport arm 10 has a U-shaped substrate carrier 10a with a suitably opening forward end so as not to interfere with the support pins 5 on the turntable 3 when transporting the wafer W into and out of the apparatus. The substrate carrier 10a has three projections 10d (FIG. 13) to support the wafer W through point contact with the lower surface of wafer W.

Operations of the above embodiment will be described next.

(1) Introduction of the Wafer:

When the wafer W is introduced into the treating apparatus by the transport arm 10, the cup-shaped housing 8 is lowered and the turntable 3 is at rest. At this time, the hoisting member 7a of each hoisting mechanism 7 assumes a position shown in solid lines in FIG. 3, in which the working arm $7a_1$ extends horizontally due to the gravity force resulting from weight 7b attached to the lower end of the depending arm $7a_2$. Since the working arm $7a_1$ lies below the upper surface of the turntable 3, the vertically movable disk 6 rests on the plurality of tiny projections 50 arranged on the upper surface of the turntable 3 (i.e. in a lowered position).

In this state, the transport arm 10 enters the treating apparatus with the wafer W placed on the substrate carrier 10a, and moves to a position over the substrate holder 1. Then, the transport arm 10 is lowered to transfer the wafer 3 onto the support pins 5 on the turntable 3. Subsequently, the transport arm 10 moves backward to retract from the treating apparatus. To enable the transport arm 10 to carry out a series of wafer transfer operations, the support pins 5 have a height (level of the upper surfaces of flanges 5b) suitably selected to form, between the wafer W and the vertically movable disk 6 in the lowered position, a gap G1 slightly larger than a thickness of the transport arm 10. In this embodiment, the gap G1 is approximately 13 mm.

(2) Spin Treatment:

The cup-shaped housing 8 is raised to a predetermined position to surround the substrate holder 1. Next, the nozzle 9 is moved to the center of rotation of the substrate holder 1. Then, the motor 2 is started to rotate the turntable 3 and wafer W together at a predetermined velocity.

As the turntable 3 rotates at increasing velocity, a greater centrifugal force acts on the weight 7b of each hoisting mechanism 7, whereby the hoisting member 7a begins to pivot. As a result, the working arms $7a_1$ of the three hoisting mechanisms 7 project from the upper surface of the turntable 3 to raise the vertically movable disk 6 gradually in horizontal posture. As the turntable 3 approaches a predetermined rotating velocity, the movable disk 6 reaches a raised position to contact lower surfaces of the flanges 5b of the support pins 5. The movable disk 6 is maintained in this position during the spin treatment. The wafer W and the movable disk 6 in the raised position define a gap G2 therebetween. The smaller the gap G2 is, the better result is obtained as long as no interference occurs between the wafer W and the movable disk 6. In this embodiment, the lower surfaces of the flanges 4b of the support pins 5 are set to such a level that the gap G2 is 1 to 1.5 mm.

The raised position of the vertically movable disk 6 may be determined by other means than the support pins 5 used in this embodiment. For example, a separate, position or angle adjusting stopper mechanism may be provided to limit the upward movement of the movable disk 6 or pivotal movement of the hoisting members 7a.

When the turntable 3 reaches the predetermined velocity, the treating liquid is supplied from the nozzle 9 to the wafer W. The treating liquid then flows over the wafer W under the rotating force thereof to effect a predetermined treatment of the wafer surface. Superfluous part of the treating liquid scatters from the periphery of the wafer W. Part of the scattering liquid turns into mist to float inside the cup-shaped housing 8. However, the mist can hardly reach the lower, reverse side of wafer W during the spin treatment since the vertically movable disk 6 is disposed in the raised position to define only a very small gap between the wafer W and movable disk 6. Thus, the reverse side of wafer W is effectively protected from the mist.

(3) Removal of the Wafer:

The motor 2 is stopped upon completion of the spin treatment, whereby the rotating velocity of the turntable 3 gradually becomes slower. Then, the centrifugal force acting on the weight 7b of each hoisting mechanism 7 diminishes, allowing the hoisting member 7a to pivot back to the original position shown in the solid lines in FIG. 3. As a result, the vertically movable disk 6 supported by the hoisting members 7a descends gradually and, when the rotating velocity lowers to a certain level, returns to the lowered position resting on the plurality of tiny projections 50 formed on the turntable 3.

When the turntable 3 stops rotating, the cup-shaped housing 8 is lowered, and the transport arm 10 moves into a relatively large space formed between the wafer W and the movable disk6 in the lowered position. Subsequently, the transport arm 10 is raised to pick up the treated wafer W from the substrate holder 1, and is retracted to transport the wafer W out of the treating apparatus.

This embodiment utilizes the centrifugal force generated by the rotation of the turntable 3, for causing the hoisting member 7a of each hoisting mechanism 7 to pivot, and thereby raise the vertically movable disk 6. Thus, no actuator such as an air cylinder or motor, is required for driving the vertically movable disk 6. Moreover, the movable disk 6 is movable according to the rotating velocity of the turntable 3, which does not require any timing control for driving the movable disk 6.

In this embodiment, the plurality of tiny projections 50 are formed on the upper surface of the turntable 3 to minimize an area of contact between the lower surface of the vertically movable disk 6 and the upper surface of the turntable 3. Thus, even if the treating liquid exists between the movable disk 6 and turntable 3, the movable disk 6 may be raised off the turntable 3 with ease.

Figure 4:
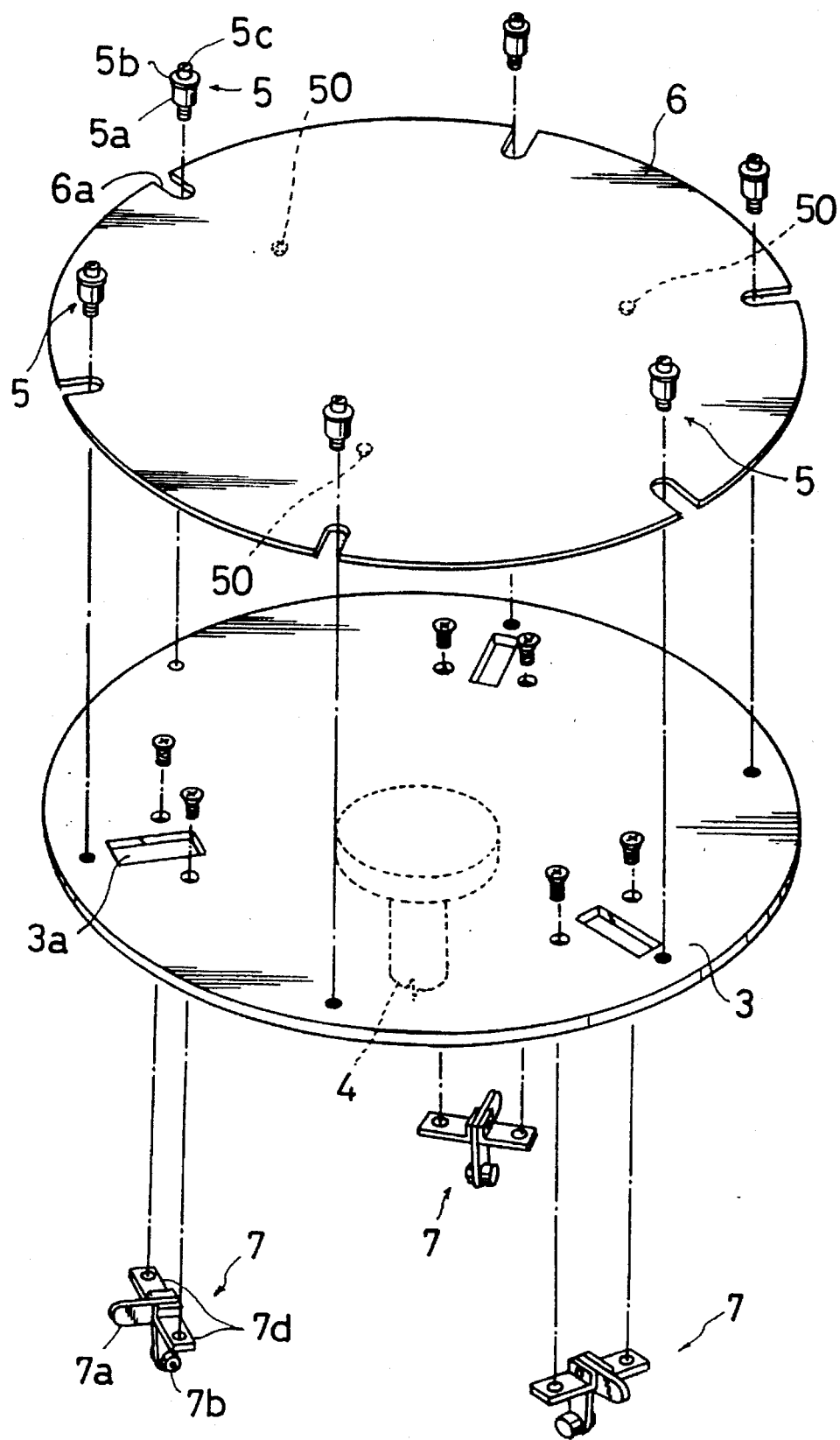
FIG. 4 is an exploded perspective view of a modified substrate holder.

As shown in FIG. 4, the tiny projections 50 may be formed on the lower surface of the vertically movable disk 6 instead of the upper surface of the turntable 3. Further, the guide bores 6a formed in the movable disk 6 need not be circular. As shown in FIG. 4, the movable disk 6 may define U-shaped guide recesses 6a opening outward and having an inward portion slightly wider than the shanks 5a of the support pins 5.

Figure 5:
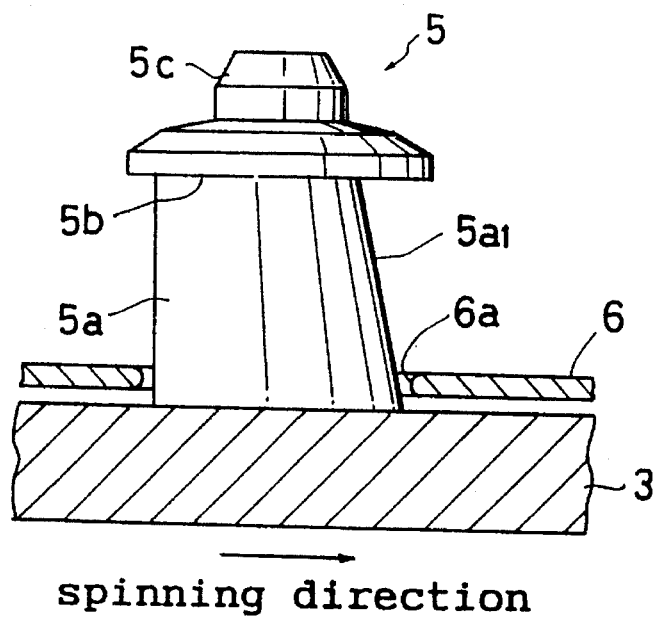
FIG. 5 is a view, partly in section, of a modified vertically movable disk and a modified support pin.

The vertically movable disk 6 and/or support pins 5 may be modified as shown in FIG. 5, to enable the movable disk 6 to move up and down smoothly along the shanks 5a of the support pins 5 with rotation of the turntable 3. In this example, each guide bore 6a in the movable disk 6 is shaped to have a semicircular wall section. This configuration provides a reduced area of contact between the shanks 5a and guide bores 6a in the movable disk 6, whereby the movable disk 6 is smoothly movable up and down along the shanks 5a of the support pins 5 with rotation of the turntable 3.

Further, the movable disk 6 may be raised with increased smoothness by sloping a forward side of each shank 5a with respect to a spinning direction of the turntable 3. The movable disk 6 spins with the turntable 3, with inward walls of the guide bores 6a pressed against the shanks 5a of the support pins 5. When the movable disk 6 is raised in this state by the hoisting mechanisms 7, each shank 5a is subjected to a composite vector combining an upward vector exerted by the hoisting mechanism 7 and a vector opposite to the spinning direction of the turntable 3. This composite vector has an obliquely upward direction opposite to the spinning direction of the turntable 3. By shaping each shank 5a to slope downward along this obliquely upward force, the movable disk 6 may move upward smoothly.

The direction of the composite vector is variable with the lifting force of the hoisting mechanisms 7 and rotating velocity of the turntable 3. It is therefore preferable to take these factors into account in determining a sloping angle.

Figure 6A:
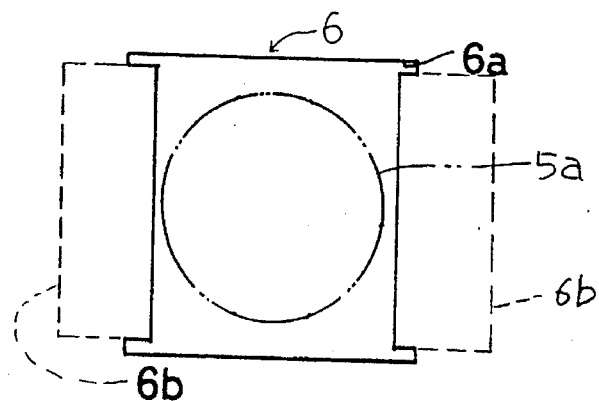
FIGS. 6A and 6B are a plan view and a view in vertical section, respectively, showing another modified example of a vertically movable disk.
Figure 6B:
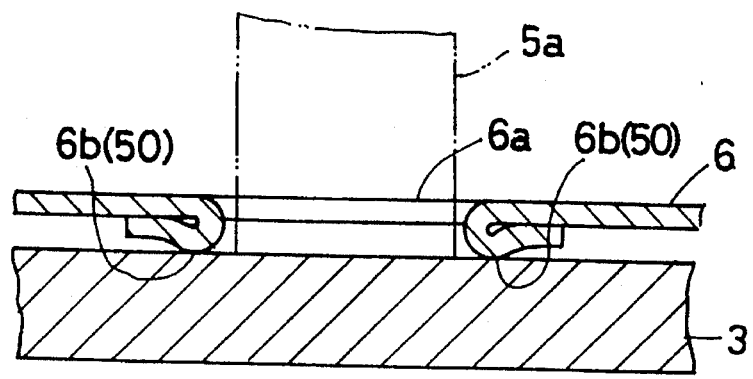

The guide bores 6a may be rectangular rather than circular in plan view. Particularly where the movable disk 6 is formed of metal such as stainless steel plate, the movable disk 6 is initially punched to form guide bores 6a in shape of letter "I". Next, tongues 6b formed by the punching are bent over toward the turntable 3 as shown in plan in FIG. 6A. As shown in vertical section in FIG. 6B, each rectangular guide bore 6a thereby formed has the tongues 6b each presenting a semicircular configuration having a reduced area of contact with the shank 5a of the support pin 5. Consequently, the movable disk 6 is smoothly movable along the shanks 5a with rotation of the turntable 3. Besides defining the guide bores 6a, the tongues 6b bent over defines tiny projections 50 on the lower surface of the movable disk 6 adjacent the guide bores 6a. As noted hereinbefore, the tiny projections 50 allow the movable disk 6 to be raised off the turntable 3 with ease even if the treating liquid exists between the movable disk 6 and turntable 3. According to the above modification, such tiny projections 50 may be formed on the movable disk 6 simultaneously with the guide bores 6a.

Second Embodiment

Figure 7:
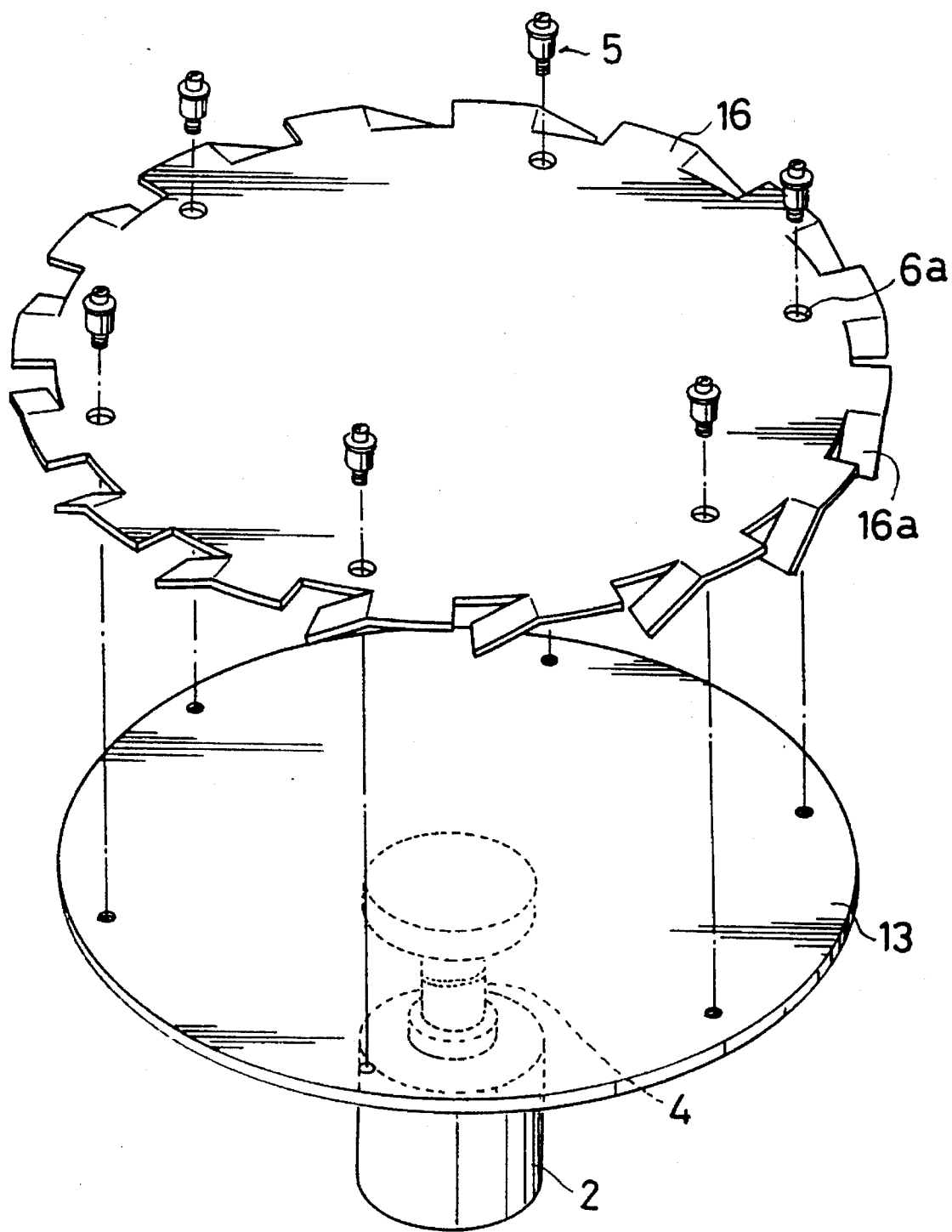
FIG. 7 is an exploded perspective of a substrate holder according to a second embodiment of the invention.

FIG. 7 is an exploded perspective view of a substrate holder 1 in a second embodiment. The aspects of this embodiment excluded from FIG. 7 are the same as in the first embodiment, and will not be described again.

Numeral 16 in FIG. 7 denotes a vertically movable disk. The movable disk 16 includes a plurality of fins 6a arranged peripherally thereof. These fins 16a are formed by cutting the movable disk 16 through a suitable length from peripheral edges toward its center to form tongues, and bending the tongues downward by a suitable angle. As in the first embodiment, the movable disk 16 is placed on the turntable 3 to be movable only vertically under guiding action of the shanks 5a of the support pins 5.

Figure 8:
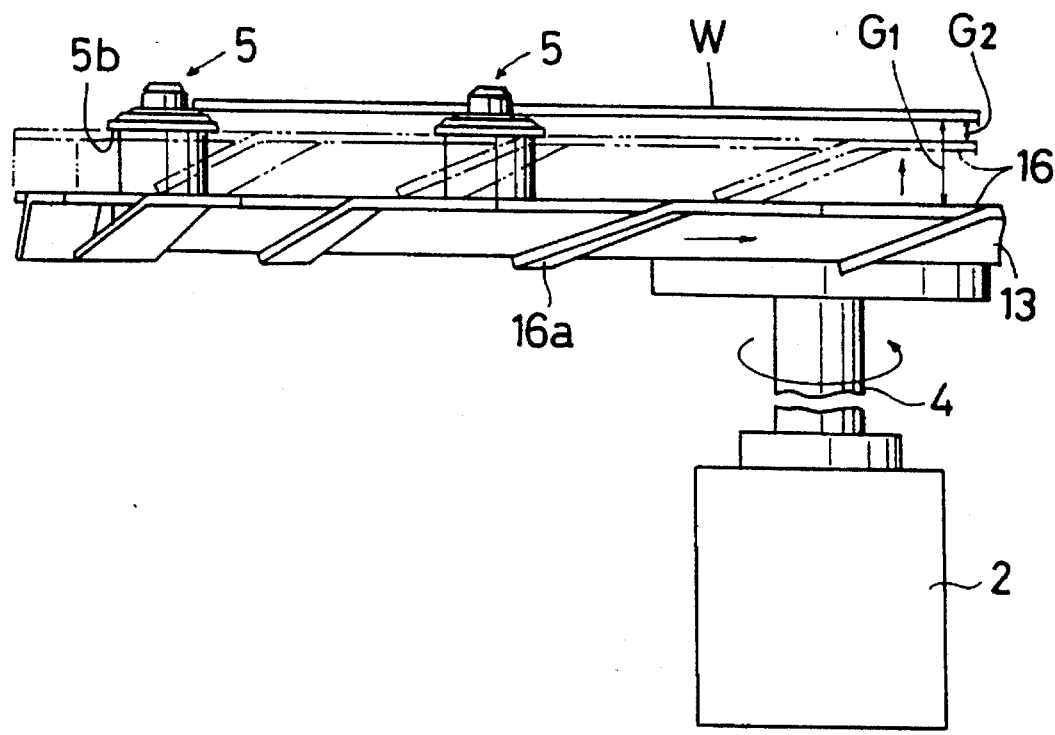
FIG. 8 is a fragmentary side elevation of the substrate holder in the second embodiment.

Operations of the substrate holder in this embodiment will be described next with reference to FIG. 8 which is an enlarged front view of a principal portion of the substrate holder 1.

The motor 2 is at rest when the wafer W is introduced. Thus, the movable disk 16 lies in a lowered position on the turntable 13 as shown in solid lines in FIG. 8.

When the motor 2 drives the turntable 13 at a predetermined velocity to effect a spin treatment, the vertically movable disk 16 spins also. Then the fins 16a arranged peripherally of the movable disk 16 push ambient gas downward. In reaction thereto, an upward component of force, or lift, acts on the fins 16a. The lift acting on the fins 16a raises the movable disk 16 into contact with the lower surfaces of the flanges 5b of the support pins 5. The gap G1 between the wafer W and movable disk 16 is now reduced to gap G2 to prevent the mist from reaching the lower, reverse side of wafer W.

When the motor 2 is stopped upon completion of the spin treatment and the rotating velocity of the turntable 3 gradually becomes slower, the lift acting on the fins 16a diminishes and the movable disk 16 descends as a result. When the rotating velocity lowers to a certain level, the movable disk 16 returns to the position resting on the upper surface of the turntable 3. The large gap G1 is now formed between the wafer W and movable disk 16 to accept the transport arm 10.

This embodiment utilizes the lift acting on the fins 16a with rotation of the turntable 3, to move the vertically movable disk 16. Thus, no additional actuator is required for driving the movable disk 16. As in the first embodiment, no control of timing is required for driving the movable disk 16.

Third Embodiment

Figure 9:
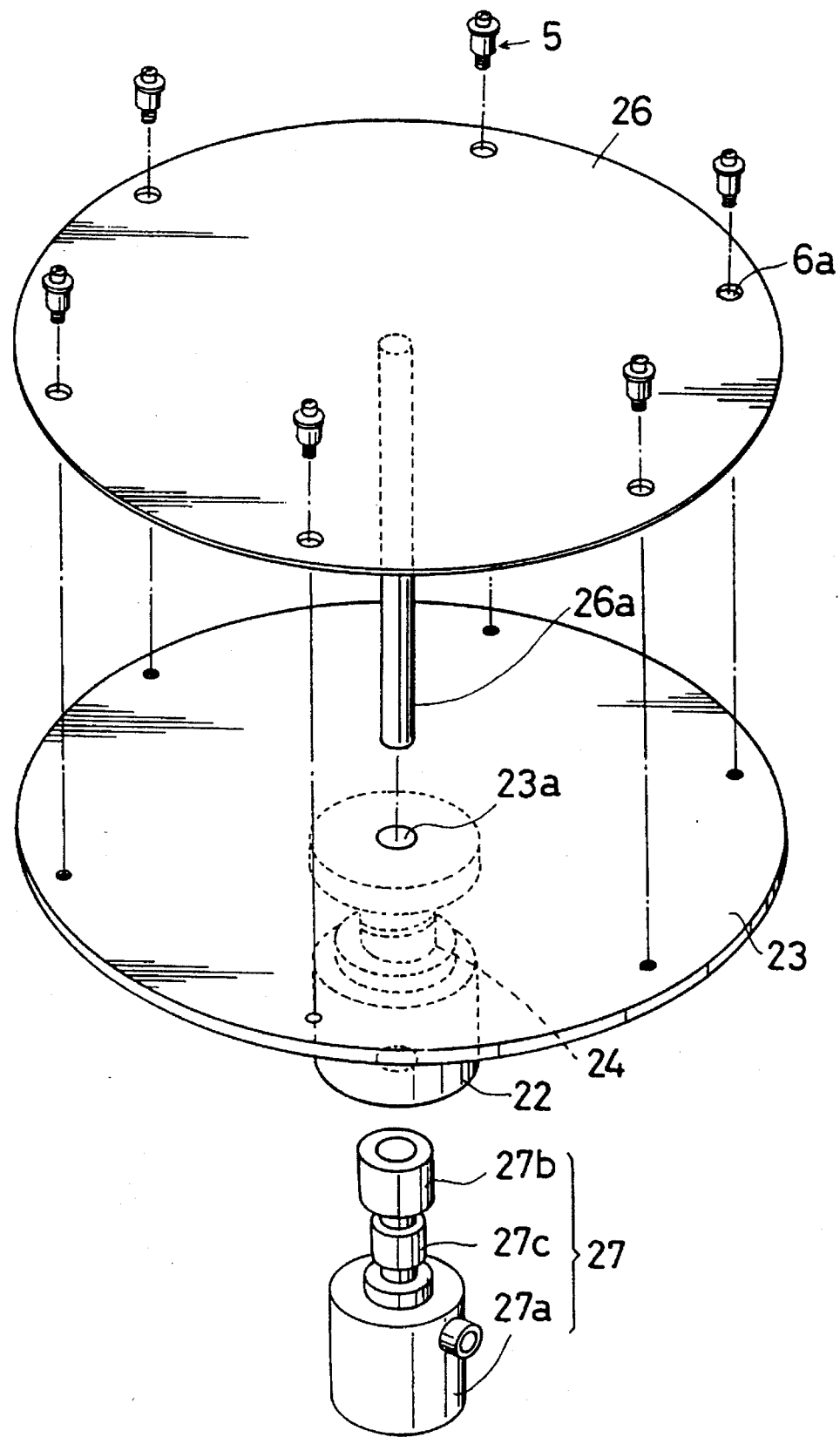
FIG. 9 is an exploded perspective of a substrate holder according to a third embodiment of the invention.

FIG. 9 is an exploded perspective view of a substrate holder 1 in a third embodiment. The aspects of this embodiment excluded from FIG. 9 are the same as in the first embodiment, and will not be described again.

Numeral 23 in FIG. 9 denotes a turntable. The turntable 23 defines an opening 23a centrally thereof for receiving a push rod 26a described hereinafter.

A hollow rotary shaft 24 driven by a motor 22 is attached centrally of a lower surface of the turntable 23 and in communication with the opening 23a.

A vertically movable disk 26 is disposed over the turntable 23, with the push rod 26a connected centrally of a lower surface of the movable disk 26. The push rod 26a extends through the opening 23a of the turntable 23 and a through hole of the rotary shaft 24, and has a lower end thereof projecting from a bottom of the motor 22. The projecting lower end of the push rod 26a is connected to a hoisting mechanism 27.

The hoisting mechanism 27 includes an air cylinder 27a, a bearing 27b for rotatably supporting the lower end of the push rod 26a, and a joint 27c for interconnecting the bearing 27b and a rod of the air cylinder 27a.

Figure 10:
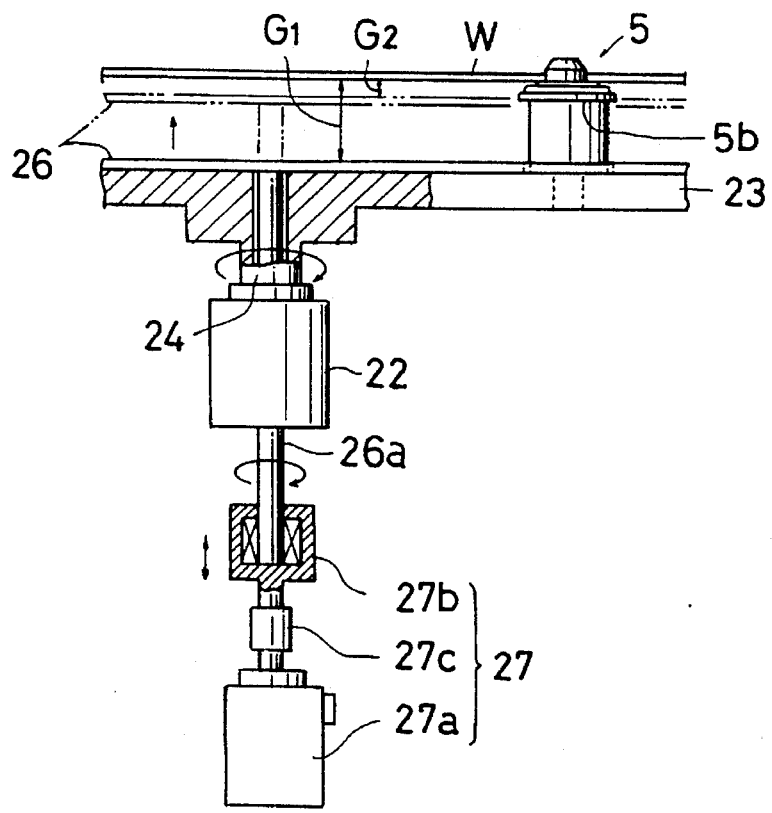
FIG. 10 is a fragmentary side elevation, partially sectioned, of the substrate holder in the third embodiment.

Operations of the substrate holder in this embodiment will be described next with reference to FIG. 10 which is an enlarged front view, partly in section, of a principal portion of the substrate holder 1.

The rod of the air cylinder 27a is retracted when the wafer W is introduced. Thus, the movable disk 26 lies in a lowered position on the turntable 23 as shown in solid lines in FIG. 10.

When the motor 22 drives the turntable 23 at a predetermined velocity to effect a spin treatment, the vertically movable disk 26 spins also. When the turntable 23 reaches a predetermined rotating rate, the rod of the air cylinder 27a is extended to move the wafer W to a position to receive treating liquid. Then the treating liquid is supplied to effect a desired treatment. The small gap G2 is formed between the wafer W and movable disk 26 to prevent the mist from reaching the lower, reverse side of wafer W.

When the turntable 23 is stopped upon completion of the spin treatment, the rod of the air cylinder 27a is retracted to lower the movable disk 26 to the position resting on the turntable 3. The large gap G1 is now formed for the transport arm 10 to advance and then carry the wafer W out of the apparatus.

This embodiment provides the advantage of freely setting timing for vertical movement of the movable disk 26. Thus, it is possible, for example, to raise the movable disk 26 while the turntable 23 remains still, then to supply the treating liquid to the wafer W, and subsequently to spin the turntable 23.

Fourth Embodiment

Figure 11:
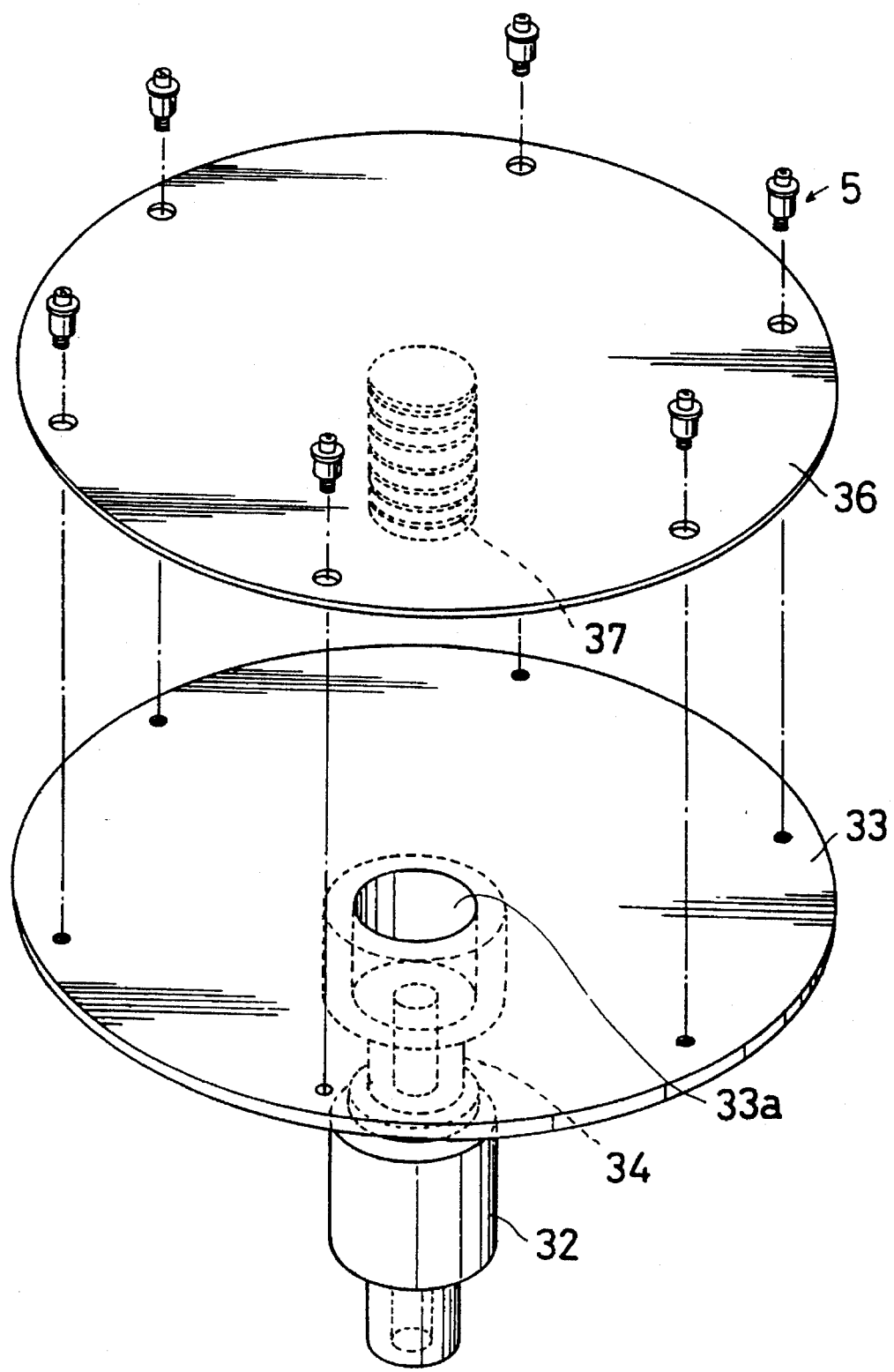
FIG. 11 is an exploded perspective of a substrate holder according to a fourth embodiment of the invention.

FIG. 11 is an exploded perspective view of a substrate holder 1 in a fourth embodiment. The aspects of this embodiment excluded from FIG. 11 are the same as in the first embodiment, and will not be described again.

Numeral 33 in FIG. 11 denotes a turntable which defines an opening 33a centrally thereof for receiving a bellows 37 described hereinafter.

A hollow rotary shaft 34 driven by a motor 32 is attached centrally of a lower surface of the turntable 33 and in communication with the opening 33a. The rotary shaft 34 extends through the motor 32 and connected at a lower end thereof selectively to a pressurized air source 40 and a vacuum source 41 through a three-way valve 42 (see FIG. 12).

A vertically movable disk 36 is disposed over the turntable 23, with one end of the bellows 37 connected centrally of a lower surface of the movable disk 36. The bellows 37 extends through the opening 33a of the turntable 33 to communicate at the other end thereof with a through hole of the rotary shaft 24.

Figure 12:
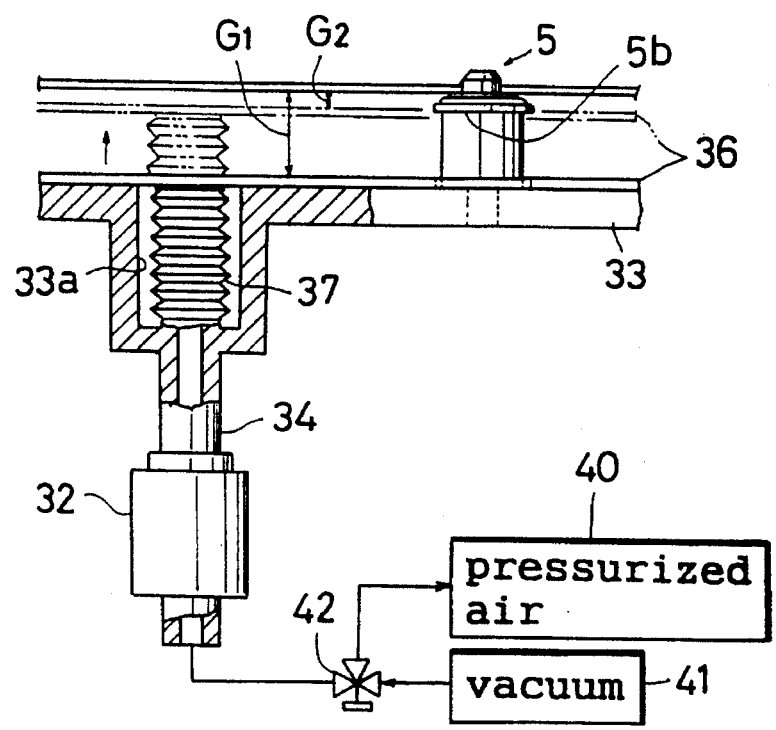
FIG. 12 is a fragmentary side elevation, partially sectioned, of the substrate holder in the fourth embodiment.

Operations of the substrate holder in this embodiment will be described next with reference to FIG. 12 which is an enlarged front view, partly in section, of a principal portion of the substrate holder 1.

When the wafer W is introduced, pressurized air is not supplied from the pressurized air source 40 to the bellows 37, or the three-way valve 42 is switched to the vacuum source 41 for causing the bellows 37 to be decompressed by the vacuum source 41. Thus, the movable disk 36 lies in a lowered position on the turntable 33 as shown in solid lines in FIG. 12.

When the motor 32 drives the turntable 33 at a predetermined velocity to effect a spin treatment, the vertically movable disk 36 spins also. After the turntable 33 reaches a predetermined rotating rate and before treating liquid is supplied, the three-way valve 42 is switched to the pressurized air source 40. As a result, air is supplied under pressure via the through hole of the rotary shaft 34 to the bellows 37 to stretch the bellows 37. This raises the vertically movable disk 36 to the position contacting the lower surfaces of the flanges 5b of the support pins 5. In this state, the treating liquid is supplied to effect a desired treatment of wafer W. At this time, the small gap G2 is formed between the wafer W and movable disk 36 to prevent the mist from reaching the lower, reverse side of wafer W.

When the turntable 33 is stopped upon completion of the spin treatment, the three-way valve 42 is switched to the vacuum source 41. The bellows 37 is decompressed via the through hole of the rotary shaft 34 to contract the bellows 37. The movable disk 36 is thereby lowered to the position resting on the turntable 33 to secure the large gap G1 for the transport arm 10 to transport the wafer W out of the apparatus.

FIG. 13 shows an example of configuration of the transport arm 10 for transporting the wafer W to and from the substrate holder 1 which supports the circular wafer W with six support pins 5 as shown in the embodiments. The transport arm 10 includes an arm body 10a, two long fingers 10b attached to a distal end thereof, and a short finger 10c attached to the distal end between the long fingers 10b. The long fingers 10b and short finger 10c have wafer supporting projections 10d formed on upper surfaces thereof. The long fingers 10b and short finger 10c are movable clear of the support pins 5 to the upper surface of the turntable 3 when the turntable 3 stops at a predetermined angle of rotation. FIG. 13 shows, in broken lines, positions of the support pins 5 when the turntable 3 stops at the predetermined angle for the transport arm 10 to transport the wafer W and, in a dot-and-dash line, the position of the wafer W at this time.

In the second, third and fourth embodiments, as in the first embodiment, the plurality of tiny projections may be formed on the upper surface of the turntable or on the lower surface of the vertically movable disk to minimize the area of contact between the two surfaces. With this construction, the movable disk 6 may be raised off the turntable 3 with ease even if the treating liquid exists therebetween.

In the second, third and fourth embodiments, as in the modification of the first embodiment, the shank of each support pin may be shaped to slope downward, and each guide bore shaped to have a semicircular wall section. This construction enables the movable disk to move up and down smoothly.

The foregoing embodiments may be adapted to effect also back-rinsing for the wafer if the wafer is the type invulnerable to back-rinsing. This will enhance the effect of preventing the mist from adhering to the lower, reverse side of the wafer.

The present invention is applicable to various types of substrate spin treating apparatus having a substrate holder, without being limited to a particular type of treatment. Thus, the invention may be applied to a photoresist spin coating apparatus, substrate spin cleaning apparatus, substrate spin developing apparatus, substrate spin etching apparatus and the like.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate holder for use in a substrate spin treating apparatus which carries out a desired treatment by supplying treating liquid to an upward facing surface of a substrate that is spinning, said substrate holder comprising:

a turntable rotatable in a horizontal plane;

drive means for rotating said turntable;

support means arranged on said turntable for supporting a substrate in a horizontal posture and spaced above an upper surface of said turntable;

a vertically movable member disposed between said turntable and a substrate being supported by said support means; and raising and lowering means for lowering said vertically movable member to a lower position adjacent said turntable when said turntable is at rest, and raising said vertically movable member to an upper position where said vertically movable member is adjacent a substrate being supported by said support means to protect a lower surface of the substrate from adhesion of the treatment liquid when said turntable is in rotation.

2. A substrate holder as defined in claim 1, further comprising the substrate, wherein said vertically movable member is slightly larger than the substrate being supported by said support means.

3. A substrate holder as defined in claim 1, wherein said support means comprises a plurality of support pins.

4. A substrate holder as defined in claim 3, wherein each of said support pins comprises a cylindrical shank extending through said vertically movable member, a flange formed at an upper end of said shank and having an upper surface thereof sloping downward to contact and support and edge of a substrate, and a small upward projection formed on said flange for preventing horizontal movement of the substrate being supported by said support means.

5. A substrate holder as defined in claim 4, wherein said vertically movable member has guide bores formed in peripheral positions thereof corresponding to said support pins, said guide bores having a slightly larger diameter than said shanks.

6. A substrate holder as defined in claim 4, wherein said vertically movable member has outwardly opening U-shaped guide cutouts formed in peripheral positions thereof corresponding to said support pins, said guide cutouts having a slightly larger width than said shanks.

7. A substrate holder as defined in claim 1, wherein said raising and lowering means comprises a plurality of hoisting mechanisms arranged on a lower surface of said turntable, each of said hoisting mechanisms including an inverted L-shaped hoisting member having a working arm and a depending arm, a weight fixed to a lower end of said depending arm, a pin extending through an intermediate bend portion of said hoisting member, and bearings for supporting said pin such that an axis of said pin extends tangentially of rotation of said turntable and that said working arm is disposed outwardly of said pin, said turntable defining a plurality of openings each for allowing said working arm to project upward through a respective one of said openings when said turntable is in rotation.

8. A substrate holder as defined in claim 1, wherein said vertically movable member in said upper position forms a gap of 1 to 1.5 mm between a lower surface of the substrate being supported by said support means and an upper surface of said vertically movable member.

9. A substrate holder as defined in claim 1, wherein there are a plurality of tiny projections formed on said upper surface of said turntable, and with said vertically movable member in its said lower position, said tiny projections contacting said vertically movable member to maintain a narrow gap between said vertically movable member and said upper surface of said turntable.

10. A substrate holder as defined in claim 1, wherein said vertically movable member has a plurality of tiny projections formed on a lower surface thereof, said tiny projections contacting said turntable when said vertically movable member is in said lower position to maintain a narrow gap between said lower surface and said turntable.

11. A substrate holder as defined in claim 5, wherein each of said guide bores has an inner edge shaped to have a semicircular wall section for contacting said shank.

12. A substrate holder as defined in claim 4, wherein said shank has a downwardly sloping forward side with respect to a direction of rotation of said turntable.

13. A substrate holder as defined in claim 1, wherein said raising and lowering means comprises a plurality of fins arranged peripherally of said vertically movable member, said fins being formed by cutting said vertically movable member from its peripheral edge toward a center thereof to form tongues, and bending said tongues downward by a predetermined angle.

14. A substrate holder as defined in claim 1, wherein said raising and lowering means comprises a push rod extending through an opening formed in said turntable and having an upper end attached to a lower surface of said vertically movable member, and an actuator for operating said push rod to vertically drive said vertically movable member.

15. A substrate holder as defined in claim 14, wherein said actuator comprises a bearing rotatably supporting a lower end of said push rod, and an air cylinder connected to said push rod to move said push rod vertically.

16. A substrate holder as defined in claim 1, wherein said raising and lowering means comprises a bellows extending through a central opening of said turntable and having an end thereof connected to a lower surface of said vertically movable member, and an actuator connected to the other end of said bellows for extending and contracting said bellows.

17. A substrate holder as defined in claim 16, wherein said actuator includes pressurized air supply means for feeding air under pressure into said other end of said bellows to extend said bellows, and suction means for sucking air from said bellows to contract said bellows.

* * * * *